United States Patent
Kuo

(10) Patent No.: US 9,177,642 B1
(45) Date of Patent: Nov. 3, 2015

(54) CROSSBAR RRAM ARRAY RADIATION HARDENED APPLICATION

(71) Applicant: Crossbar, Inc., Santa Clara, CA (US)

(72) Inventor: Harry Kuo, Palo Alto, CA (US)

(73) Assignee: Crossbar, Inc., Santa Clara, CA (US)

( * ) Notice: Subject to any disclaimer, the term of this patent is extended or adjusted under 35 U.S.C. 154(b) by 412 days.

(21) Appl. No.: 13/837,875

(22) Filed: Mar. 15, 2013

(51) Int. Cl.
  *G11C 11/00* (2006.01)
  *G11C 13/00* (2006.01)
  *H01L 45/00* (2006.01)

(52) U.S. Cl.
  CPC ........ *G11C 13/0069* (2013.01); *G11C 13/0002* (2013.01); *H01L 45/1253* (2013.01)

(58) Field of Classification Search
  CPC ..................................................... G11C 11/00
  USPC ............. 365/46, 94, 100, 129, 148, 158, 163; 257/2–5, 9, 295, 310, E21.35; 438/95, 438/96, 135, 166, 240, 365, 482, 486, 597, 438/785
  See application file for complete search history.

(56) References Cited

U.S. PATENT DOCUMENTS

| | | | | |
|---|---|---|---|---|
| 7,139,188 B2 * | 11/2006 | Moore et al. | ................... | 365/148 |
| 7,701,745 B2 * | 4/2010 | Joo et al. | ........................ | 365/148 |
| 8,206,995 B2 * | 6/2012 | Reyes et al. | ....................... | 438/3 |
| 8,279,656 B2 * | 10/2012 | Chien et al. | ................... | 365/148 |
| 2011/0317471 A1 * | 12/2011 | Chien et al. | ................... | 365/148 |

* cited by examiner

*Primary Examiner* — Harry W Byrne
(74) *Attorney, Agent, or Firm* — Amin, Turocy & Watson, LLP

(57) ABSTRACT

A method for programming a non-memory device comprising a plurality of resistive switching device. Each of the plurality of resistive switching device includes a resistive switching material characterized by a resistance characterized by a state depending on a conductive filament structure. A first programming code file to configure a system to perform a predetermined task is provided. The programmability of each of the plurality of resistive switching device is maintained. The system receives the first programming code file, executing the first programming code file, and verifies and validates that the system performs the predetermined task. Once the first programming code file is validated, the conductive filament in one or more resistive switching device is fixed spatially in a portion of the resistive switching material of the respective one or more resistive switching device by applying joule heating programming. The programmability of each of the memory device is removed.

26 Claims, 3 Drawing Sheets

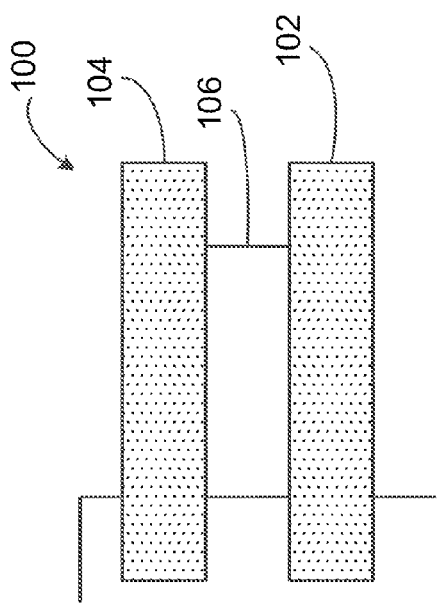
Fig. 1
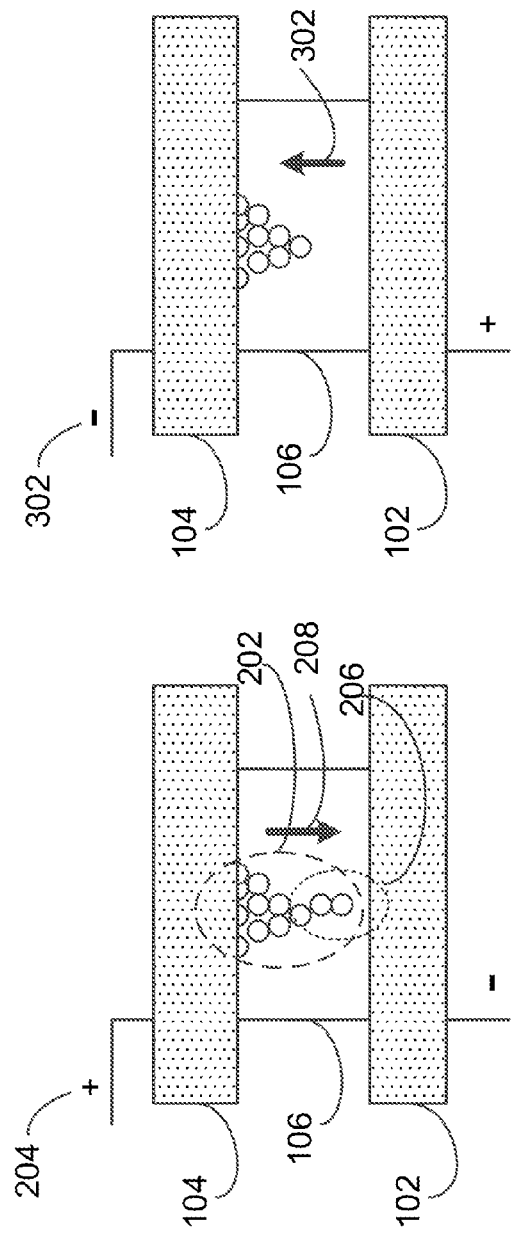
Fig. 2
Fig. 3

CROSSBAR RRAM ARRAY RADIATION HARDENED APPLICATION

BACKGROUND

The inventor of the present invention has recognized the success of semiconductor devices has been mainly driven by an intensive transistor down-scaling process. However, as field effect transistors (FETs) approach sizes less than 100 nm, physical problems such as short channel effect begin to hinder proper device operation. For transistor based memories, such as those commonly known as Flash memories, other performance degradations or problems may occur as device sizes shrink. With Flash memories, a high voltage is usually required for programming of such memories, however, as device sizes shrink, the high programming voltage can result in dielectric breakdown and other problems. Similar problems can occur with other types of non-volatile memory devices other than Flash memories.

The inventor of the present invention recognizes that many other types of non-volatile random access memory (RAM) devices have been explored as next generation memory devices, such as: ferroelectric RAM (Fe RAM); magneto-resistive RAM (MRAM); organic RAM (ORAM); phase change RAM (PCRAM); and others.

A common drawback with these memory devices include that they often require new materials that are incompatible with typical CMOS manufacturing. As an example of this, Organic RAM or ORAM requires organic chemicals that are currently incompatible with large volume silicon-based fabrication techniques and foundries. As another example of this, Fe-RAM and MRAM devices typically require materials using a high temperature anneal step, and thus such devices cannot be normally be incorporated with large volume silicon-based fabrication techniques.

Additional drawbacks with these devices include that such memory cells often lack one or more key attributes required of non-volatile memories. As an example of this, Fe-RAM and MRAM devices typically have fast switching (e.g. "0" to "1") characteristics and good programming endurance, however, such memory cells are difficult to scale to small sizes. In another example of this, for ORAM devices reliability of such memories is often poor. As yet another example of this, switching of PCRAM devices typically includes Joules heating and undesirably require high power consumption.

From the above, improved semiconductor memory devices that can scale to smaller dimensions with reduced drawbacks are therefore desirable.

BRIEF SUMMARY OF THE PRESENT INVENTION

Embodiments according to the present invention are related to resistive switching devices. More particularly, embodiments according to the present invention provide a method for programming a resistive switching device characterized by a programmed state resistant to external effect such as radiation, and others. Embodiments according to the present invention have been applied to memory devices, but it should be recognized that embodiments according to the present invention can have a much broader range of applicability.

In a specific embodiment, a method of programming a memory device is provided. The method includes providing a plurality of resistive switching device. Each of the plurality of resistive switching device includes at least a resistive switching material characterized by a state depending on a conductive filament structure in a portion of each of the plurality of resistive switching material. A first programming code file for a system is provided. The first programming code file determines the state of each of plurality of resistive switching device, and the system is configured to receive the first programming code file. In a specific embodiment, the programmability of each of the plurality of resistive switching device is maintained. The system receives the first programming code file and executes the first programming code file to perform a predetermined task. The system verifies that the first programming file provides instructions to perform the predetermined task and validates the first programming code file. Once the first programming code is verified and validated, the method applies joule heating programming to the plurality of resistive switching device. Joule heating programming causes the conductive filament in one or more selected resistive switching device in low resistant state (high bit value of "1") to be fixed spatially in a portion of the resistive switching material of the respective one or more selected resistive switching device. The method then removes programmability of each of the plurality of resistive switching device and the programming code file is locked.

In a specific embodiment, a resistive switching device for a non-volatile memory device is provided. The resistive switching device includes a first electrode and a second electrode, and a non-conductive material configured in an intersection region of the first electrode and the second electrode. In a specific embodiment, the second electrode has at least a first portion and a second portion. The first portion of the second electrode includes a metal material in physical and electric contact with the non-conductive material. The non-conductive material is characterized at least by a resistance dependent upon a filament structure derived from the metal material upon application of a first voltage to the second electrode in a specific embodiment.

Many benefits can be achieved by ways of the present memory device. For example, the present memory device can be fabricated using convention semiconductor fabricating techniques without modification to the fabrication equipment. The memory cell for code storage is provided using a resistive switching device, which provides flexibility in programming. In particular, the present device can be programmed and reprogrammed during a development stage of associated application, and only be permanently stored and not subjected to alteration after verification and validation. This is in contrast to current charge base storage devices, which lack capabilities to store critical codes permanently and securely, or one time programmable devices, which lack programmability during development stage. In addition, the present memory device can be vertically stacked to form a high density device according to a specific embodiment. More importantly, the present device structure and programming method provide for a radiation hardened memory device, which is not achievable in conventional charged base devices (for example, Flash, EEPROM EPROM, and others). Depending on the embodiment, one or more of these benefits may be achieved. One skilled in the art would recognize other variations, modifications, and alternatives.

SUMMARY OF THE DRAWINGS

In order to more fully understand the present invention, reference is made to the accompanying drawings. Understanding that these drawings are not to be considered limitations in the scope of the invention, the presently described embodiments and the presently understood best mode of the invention are described with additional detail through use of the accompanying drawings in which:

FIG. 1 is a simplified diagram illustrating a resistive switching device according to an embodiment of the present invention;

FIGS. 2 and 3 are simplified diagrams illustrating the resistive switching device during operations according to an embodiment of the present invention;

DETAILED DESCRIPTION OF THE PRESENT INVENTION

Figure 4:
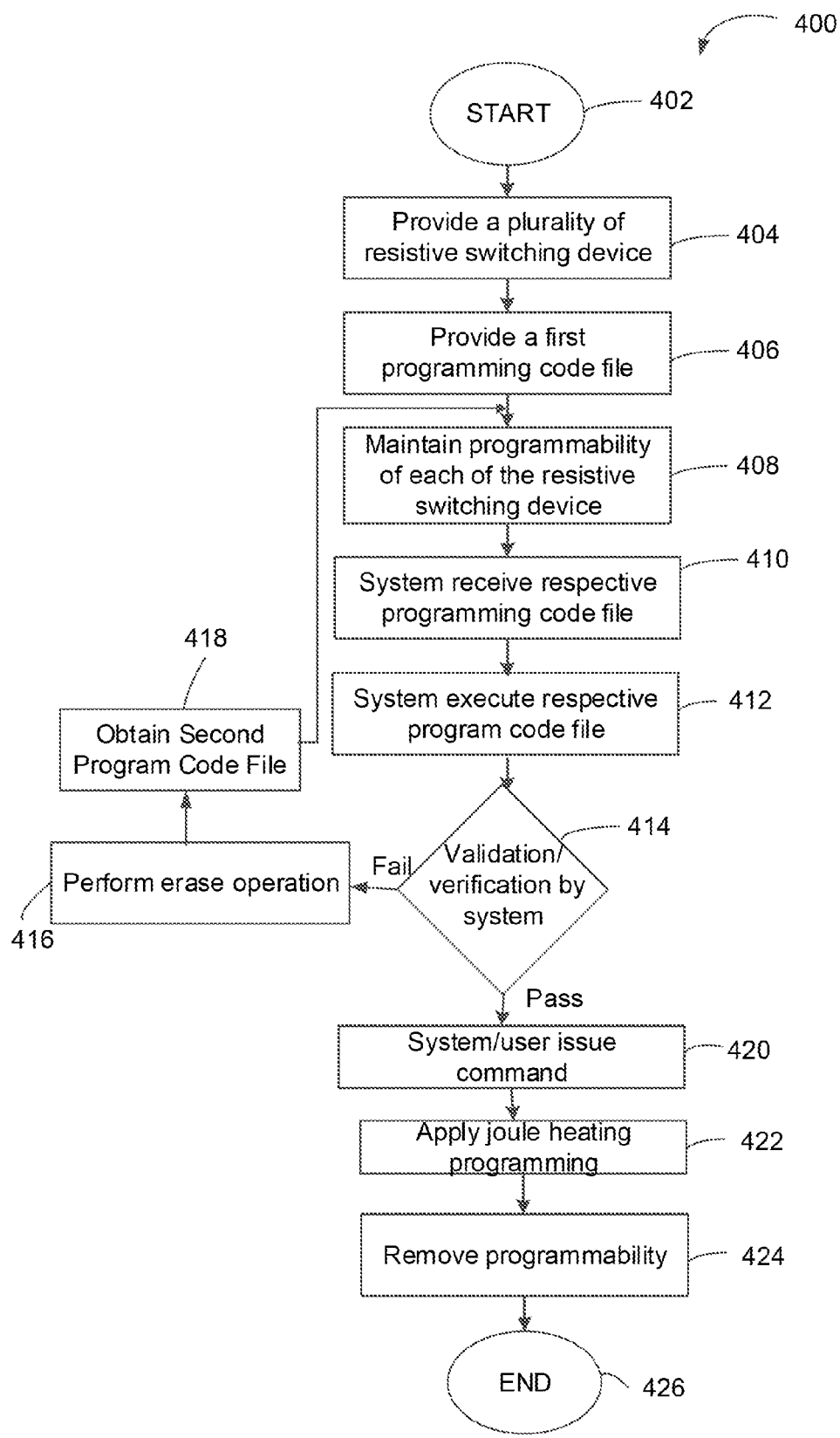
FIG. 4 is a simplified flow diagram illustrating a method of programming the resistive switching device according to an embodiment of the present invention.

Embodiments according to the present invention are directed to resistive switching device. More particularly, embodiments according to the present invention provide a device and method and for a radiation hardened device. Embodiments according to the present invention can be applied to a read only memory device. But it should be recognized that embodiments according to the present invention can have a much broader range of applicability.

In digital and other electronic devices, a read only memory device is commonly used to store certain programs and related codes that can be available at all times. The contents in the read only memory are critical for storage of operation code for a firmware. Current commonly used read only memory device include charge base ROM, and one time programmable devices, and others. These memory devices usually lack programmability. That is, once the design codes are burn in, in the factory or in the field, the codes cannot be changed or the device cannot be reprogrammed. To change the codes, a new device would need to be fabricated. Codes stored in a programmable storage device such as Flash, can be changed and the device cannot store codes or information permanently or securely Embodiments according to the present invention provide a device structure and a programming method for a memory device. The memory device is programmable during design and research phase and configured to be permanently or irreversibly programmed only after the codes have been tested and ready to be deployed. Additionally, the memory device according to the present invention is characterized by data retention that is resistant to disturbance from radiation and therefore suitable for military and space application, among others. Other applications can include situation where data need to be secured after execution. The data can be permanently erased with high degree of assurance after the design or codes have been used. Embodiments according to the present invention can be applied in system on a chip (SoC) designs, FPGA and in other standalone memories, among others. Further, the present device structure can be vertically integrated to further decrease cost per bit.

FIG. 1 is a simplified diagram illustrating a resistive switching device 100 according to an embodiment of the present invention. As shown, switching device 100 includes a first electrode 102, a second electrode 104, and a resistive switching material 106 sandwiched in an intersection region of first electrode 102 and second electrode 104. First electrode 102 can be a common conductor material used for interconnects in CMOS processing. For example, first electrode 102 can comprise of tungsten, copper, suitably doped silicon material, and others. In a specific embodiment, first electrode 102 can further include one or more diffusion barrier material or one or more adhesion material depending on the conductor material used. The one or more diffusion barrier material or one or more adhesion material can be titanium, titanium tungsten, titanium nitride, tantalum, tantalum nitride, tungsten nitride, titanium tungsten, and others. In a specific embodiment, second electrode 104 includes at least a first portion and a second portion. The first portion comprises a metal material selected from silver, gold, palladium, nickel, aluminum, zinc, and others. The metal material is characterized by a suitable diffusivity under an electric field in the resistive switching material in a specific embodiment. The second portion can include a second conductor material and forms a second wiring structure for the resistive switching device in a specific embodiment. In a specific embodiment, the first wiring structure and the second wiring structure are configured orthogonal to each other allowing for a high density crossbar array.

Resistive switching material 106 can be a non-conductive material characterized by a resistance depending on an electric field in a portion of the resistive switching material. Resistive switching material can include metal oxides such as titanium oxide, zinc oxide, silicon oxide, tungsten oxide, zirconium oxide, and others. In a specific embodiment, resistive switching material 106 can comprise of an amorphous silicon material. The amorphous silicon material is not intentionally doped, and has an intrinsic semiconductor characteristic in a specific embodiment. For amorphous silicon as the resistive switching material, the metal material of the second electrode 104 can include silver, gold, platinum, palladium, nickel, aluminum, and others. The amorphous silicon material is characterized by a plurality of defect sites to trap metal particles derived from the metal material upon application of the electric field in a specific embodiment. As shown in FIG. 2, the metal particles form a metal region 202 in a portion of the amorphous silicon material when a positive voltage 204 is applied to the second electrode. The metal region can include a filament structure 206 in a specific embodiment. The filament structure is characterized by a length and a first distance between the metal particles and a second distance between the filament structure and the first electrode. In a programming mode, resistive switching device 100 is characterized by a resistance state depending at least on the length, the first distance, and the second distance in a specific embodiment. The filament structure is configured to extend 208 when positive voltage 204 is applied. Referring to FIG. 3, the filament structure is configured to retract 304 after programming when a negative voltage or an erase voltage 302 is applied to second electrode 104. The resistive switching device is in a low resistance state or bit value "1" when the filament structure is extended and a high resistance state or a bit value "0" when the filament structure is retracted. The resistive switching device is in a programmable mode when the filament structure is allowed to extend and to retract depending on the voltage applied or the resistive switching device can be programmed, erased, and re-programmed after erase.

Taking amorphous silicon as the resistive switching material and silver as the metal material in the second electrode as an example. Programming voltage can have an amplitude ranging from about 2 volts to about 5 volts and no greater than 8 volts depending on a size of the resistive switching device. Erase voltage can have an amplitude about the same as the programming voltage, or slight lower, (for example, about 10 percent lower) depending on the device and application.

Depending on the embodiment, resistive switching device 100 can be formed overlying a substrate. The substrate can be a semiconductor material having one or more transistor device formed thereon. The one or more transistor device can be controlling circuitry for the resistive switching device in a specific embodiment. Again, depending on the embodiment, resistive switching device 100 can be operably coupled to a select element or a rectifying element as would be recognized by and obvious to one skilled in the art.

In a specific embodiment, a method of programming a memory device comprising a plurality of the resistive switching device is provided, as shown in a simplified flow diagram 400 in FIG. 4. As shown, the method begins with a start step (Step 402). A memory device is provided (Step 404). The memory device comprises a plurality of resistive switching device. Each of the plurality of resistive switching device can have a device structure 100 as in FIG. 1.

In a specific embodiment, the method includes providing a first programming code file (Step 406). The programming code file provides one or more instructions to be executed by a system, or firmware of the system and others to perform predetermined tasks, depending on the application. The system can be a device or an application, and others. The programming code file further determines the respective states of each of the plurality of resistive switching device in the memory device.

When the system is in a development state, the programmability of each of the plurality of resistive switching device is maintained. The filament structure in each of the resistive switching material maintains its capability to retract and extend by applying a suitable voltage (Step 408) as illustrated in FIGS. 2 and 3. The system can include an associated device or application, as noted. The filament structure maintains its capability to extend for programming and reprogramming and its capability to retract when an erase voltage is applied after programming. The programming code file provides the state value of each of the resistive switching device ("0" or "1") and the system or a user of the system applies an appropriate voltage accordingly (as in FIGS. 2 and 3). Additionally, the programmability of each of the resistive switching device includes at least programming, erasure, and reprogramming of each of the resistive switching device.

Referring again to FIG. 4. The system receives the first programming code file (Step 410) and executes the first programming code file (Step 412). The system verifies or validates the first programming code file (Step 414). That is, the system performs the predetermined tasks according to instructions provided in the first programming code file to verify the validity of the first programming code file. If the system performs the predetermine task according to the instructions from the first programming code file, the first programming code file is validated or pass and can be further deployed. The system or a user of the system issues a command to apply a joule heating programming to the memory device and the programming code is locked permanently in the memory device. The system or the user removes the programmability of the memory device.

If the system fails to perform the predetermined task or the validation process of the first programming code file fails, the system (or the user of the system) provides an instruction to perform an erase operation (Step 416). The erase operation can be applied to all the resistive switching devices in the memory device to cause each of the resistive switching devices in the memory device to be in a high resistance state having a low bit value. The erase operation can also be applied to each of the programmed resistive switching device having a high bit value or low resistance state to cause these resistive switching devices to be in high resistance state or erase state (as in FIG. 3). The system then obtains a second programming code file (Step 418) to provide an instruction to perform the predetermined task in the system. The steps of 406, 408, 410, 412, and 414 are performed, as shown. These steps are repeated N times as necessary until the instructions in an Nth programming code file can perform the predetermined task. Once the programming code file is verified, the method programs the memory device by applying joule heating programming (Step 422) to selected resistive switching devices if the programming code file determines that the selected resistive switching devices are to be at a low resistance state (or a high bit value of "1"). Joule heating programming permanently locks a design code in a memory device and the design code would not be affected by environmental elements such as radiation and others. The programmability of the resistive switching device (Step 424) is removed and the code is permanently locked and cannot be altered. The method ends with an END step (Step 426).

Accordingly, embodiments according to the present invention provide a resistive switching device structure for a memory device and a method to program the memory device. The device structure allows for programming and reprogramming of the resistive switching device to verify a programming code file before permanently lock and store the programming code file. The programming code file is rugged and free from interference from external elements such as radiation, and others.

Figure 5:
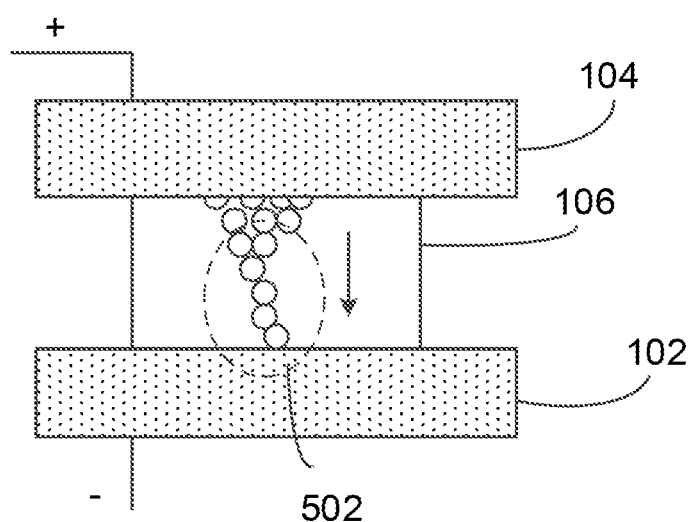
FIG. 5 is a simplified diagram illustrating resistive switching device after Joule heating programming according to an embodiment of the present invention.

As illustrated in FIG. 5, physically, joule heating programming includes applying a current high enough to cause joule heating, that is, diffusion of the metal material in the resistive switching material is controlled thermally and substantially independent from the electric field. Depending on the system and application, joule heating can also occur by applying a voltage greater than the programming voltage (about 30 percent higher, for example). Joule heating programming causes filament structure 502 to be fixed permanently in the amorphous silicon material and would not be affected by external elements such as radiation. This is especially suitable for military or space applications.

In other applications, the programming code file can be made secure after deployment. For example, the bit value residing in each of the plurality of resistive switching device can be erased in the field after the information has been used and are ready to be scrapped. Again, a joule heating programming can be applied to all the bits in the array after deployment, and the bit information in each of the resistive switching device is protected as if it has been erased. In contrast to charged based storage devices, each of the resistive switching devices is essentially identical after joule heating, reverse engineering to determine the programming code file is therefore not possible.

In certain embodiments, the conductive filament structure can be fixed spatially by applying a second voltage greater than programming voltage. For an amorphous silicon switching material and silver as the active conductive material, the second voltage is greater than the programming voltage. In a specific embodiment, the second voltage can be about 1.2 times to about 1.5 times the programming voltage. Depending on the embodiment, the second voltage can be forward bias or reverse bias to cause the filament structure to spatially fix permanently in a portion of the resistive switching material, for example, the amorphous silicon material. Of course, the amplitude of the second voltage depends at least on the dimension of the resistive switching device and a thickness of the amorphous silicon material, and others.

In a specific embodiment, the plurality of resistive switching device is configured in an array. In a specific embodiment, the first electrode can be configured orthogonal to the second electrode to form a crossbar array of memory cells, for example an N by M crossbar array. The programming code file for the array of resistive switching devices comprises instructions for the states of each of the resistive switching device in the array. The instructions can be, for example, determining if the application is in a development state or a deployment state. If the associated application is to be in a development state, the programmability of each of the plurality resistive switching device is maintained until an associated application is verified and validated. Thereafter, the array of resistive switching device is subjected to joule heating programming to cause a first set of resistive switching device to be in a low resistance state and a second set of resistance switching device to be in a high resistance state. The programmability of each of the resistive switching device is removed and the design and codes are stored permanently in the array of resistive switching device. Joule heating programming allows the codes to permanently reside in each of the resistive switching device and not affected by external influence such as radiation, and others. In another exemplified application, codes residing in the array of resistive switching device can be permanently erased after used or deployment. Again, Joule heating programming can be applied to each and every resistive switching device in the array as if it the codes are erased.

In a read operation, a read voltage is applied to selected cells in the array or all the cells in the array. The read voltage is usually less than the programming voltage and can be about half of the programming voltage in a specific embodiment. In a high bit cell, the filament structure essentially connects the first electrode and the second electrode and the current flow in the cell is high. In a highly interconnected crossbar array, leakage current form an unselected cell may result in erroneous reading in a selected cell. Depending on the application, each of the resistive switching devices in the array can be coupled to a rectifying element or a select element such that leakage current form an unselected call would not interfere with the current reading in a selected cell or accidently programming or erase may be inhibited.

Depending on the application, the present invention can be applied to any switching device where switching mechanism is filament based, for example, in certain resistive switching device using metal oxides such as zinc oxide, titanium oxide, tantalum oxide, zirconium oxide and others, as the switching material.

Though the present invention has been described using various examples and embodiments, it is also understood that the examples and embodiments described herein are for illustrative purposes only and that various modifications or alternatives in light thereof will be suggested to persons skilled in the art and are to be included within the spirit and purview of this application and scope of the appended claims.

What is claimed is:

1. A method of programming a memory device, comprising:
    providing a plurality of resistive switching device, each of the plurality of resistive switching device comprising a resistive switching material characterized by a state depending on a conductive filament structure in a portion of each of the plurality of resistive switching material;
    providing a first programming code file for a system, the first programming code file determining the state of each of plurality of resistive switching device, and the system being configured to receive the first programming code file;
    maintaining programmability of each of the plurality of resistive switching device;
    receiving the first programming code file by the system;
    executing the first programming code file by the system;
    verifying and validating the first programming code file by the system;
    applying joule heating programming to the plurality of resistive switching device to cause the conductive filament in one or more resistive switching device to be fixed spatially in a portion of the resistive switching material of the respective one or more resistive switching device after verifying and validating; and
    removing programmability of each of the plurality of resistive switching device.

2. The method of claim 1 wherein the plurality of resistive switching device is configured in an N by M array, where N and M are integers and N≥1, M≥1.

3. The method of claim 1 wherein the one or more resistive switching device is in a high bit state having a bit value of "1".

4. The method of claim 1 wherein the system comprises an application or a device operation.

5. The method of claim 1 wherein each of the plurality of resistive switching device further comprises a first electrode and a second electrode, the resistive switching material is configured in an intersection region between the first electrode and the second electrode.

6. The method of claim 1 wherein the second electrode includes at least a portion comprising a metal material and the conductor filament structure is derived from the metal material upon application of a first voltage.

7. The method of claim 1 wherein programmability comprises at least programming, erasing after programming, and re-programming of each of the plurality of resistive switching device.

8. The method of claim 1 wherein the joule heating programming comprises applying a forward bias voltage greater than a threshold voltage to cause the filament structure in the one or more resistive switching device to be spatially fixed in the portion of the resistive switching material in the respective one or more resistive switching device.

9. The method of claim 1 wherein the filament structure permanently fixed in the selected resistive switching material is not affected by external elements after joule heating programming, wherein the external elements include radiation.

10. The method of claim 1 further comprises applying joule heating to the plurality of resistive switching device in its entirety to permanently remove information in the respective programming code file after deployment of the system.

11. The method of claim 1 further comprises applying an erase operation if the first programming code file fails the verifying and validating step.

12. The method of claim 11 wherein the erase operation comprises applying a reverse bias voltage to each of the plurality of resistive switching device.

13. The method of claim 11 wherein the erase operation comprises applying a reverse bias voltage to the one or more resistive switching device in a low resistance state having a high bit value of "1".

14. The method of claim 11 further comprises providing a second programming code file for the system after the erase operation.

15. The method of claim 14 wherein the second programming code file is subjected to verification and validation by the system.

16. The method of claim 1 wherein the state of each of the plurality of resistive switching device comprises at least a high resistance state having a bit value of "0", and a low resistance state having a bit value of "1".

17. A non-volatile memory device, comprising:
a first electrode,
a second electrode, the second electrode comprising a first portion and a second portion, the first portion comprising a metal material; and
a non-conductive material configured in an intersection region of the first electrode and the second electrode, the non-conductive material being characterized at least by a resistance dependent upon a filament structure derived from the metal material upon application of a first voltage to the second electrode.

18. The device of claim 17 wherein the first electrode comprises a first conductive material, the first conductive material comprises an aluminum material, a copper material, a tungsten material or a doped silicon material.

19. The device of claim 17 wherein the first electrode comprises a first wiring structure.

20. The device of claim 17 wherein the second portion of the second electrode comprises a second wiring structure.

21. The device of claim 17 wherein the active metal material comprises silver, gold, platinum, palladium, nickel, aluminum, copper, chromium or a combination thereof.

22. The device of claim 17 wherein the active metal material forms a filament structure in a portion of the resistive switching material in a vicinity of the second electrode upon application of an electric field.

23. The device of claim 17 further comprises a serially coupled rectifying element.

24. The device of claim 17 further comprises a serially coupled select transistor.

25. The device of claim 17 wherein the first voltage is a positive voltage with respect to the first electrode.

26. The device of claim 17 wherein the non-conductive material comprises an amorphous silicon material, the amorphous silicon material having an intrinsic semiconductor characteristic and not intentionally doped.

* * * * *